United States Patent
Mitsuhashi et al.

(10) Patent No.: US 9,806,156 B2
(45) Date of Patent: Oct. 31, 2017

(54) LAMINATED BODY AND ELECTRONIC DEVICE

(71) Applicants: Sumitomo Electric Industries, Ltd., Osaka-shi (JP); TOHOKU UNIVERSITY, Sendai-shi (JP)

(72) Inventors: Fuminori Mitsuhashi, Itami (JP); Takashi Ishizuka, Itami (JP); Masaki Ueno, Itami (JP); Yoshihiro Tsukuda, Yokohama (JP); Yasunori Tateno, Yokohama (JP); Maki Suemitsu, Sendai (JP); Hirokazu Fukidome, Sendai (JP); Hiroyuki Nagasawa, Sendai (JP)

(73) Assignees: Sumitomo Electric Industries, Ltd., Osaka-shi (JP); Tohoku University, Sendai-shi (JP)

( * ) Notice: Subject to any disclaimer, the term of this patent is extended or adjusted under 35 U.S.C. 154(b) by 0 days.

(21) Appl. No.: 15/343,679

(22) Filed: Nov. 4, 2016

(65) Prior Publication Data

US 2017/0148880 A1    May 25, 2017

(30) Foreign Application Priority Data

Nov. 6, 2015  (JP) .................... 2015-218773

(51) Int. Cl.
- *H01L 29/16* (2006.01)
- *H01L 29/06* (2006.01)
- (Continued)

(52) U.S. Cl.
CPC .... *H01L 29/1606* (2013.01); *H01L 21/02378* (2013.01); *H01L 21/02527* (2013.01);
(Continued)

(58) Field of Classification Search
CPC ........... H01L 29/1606; H01L 21/02378; H01L 21/02527; H01L 21/043; H01L 21/044;
(Continued)

(56) References Cited

U.S. PATENT DOCUMENTS

| 2010/0109712 A1* | 5/2010 | Zaliznyak | B82Y 25/00 327/100 |
| 2011/0309336 A1* | 12/2011 | Shin | B82Y 10/00 257/29 |

(Continued)

FOREIGN PATENT DOCUMENTS

JP    2015-048258 A    3/2015

OTHER PUBLICATIONS

Horn et al. "Towards wafer-size graphene layers by atmospheric pressure graphitization of silicon carbide", Nature Materials, Mar. 2009, pp. 203-207.*

*Primary Examiner* — Karen Kusumakar
(74) *Attorney, Agent, or Firm* — Venable LLP; Michael A. Sartori; Kerri M. Patterson

(57) ABSTRACT

A laminated body includes: a substrate portion composed of silicon carbide; and a graphene film disposed on a first main surface of the substrate portion, the graphene film having an atomic arrangement oriented with respect to an atomic arrangement of the silicon carbide of the substrate portion. A region in which a value of G'/G in Raman spectrometry is not less than 1.2 is not less than 10% in an area ratio in an exposed surface of the graphene film, the exposed surface being a main surface of the graphene film opposite to the substrate portion.

5 Claims, 6 Drawing Sheets

(51) Int. Cl.
*H01L 29/786* (2006.01)
*H01L 21/02* (2006.01)
*H01L 21/04* (2006.01)
*H01L 29/66* (2006.01)

(52) U.S. Cl.
CPC .......... *H01L 21/043* (2013.01); *H01L 21/044* (2013.01); *H01L 29/0657* (2013.01); *H01L 29/66045* (2013.01); *H01L 29/78684* (2013.01)

(58) Field of Classification Search
CPC ........... H01L 29/0657; H01L 29/66045; H01L 29/78684
See application file for complete search history.

(56) References Cited

U.S. PATENT DOCUMENTS

| | | | | |
|---|---|---|---|---|
| 2012/0068157 A1* | 3/2012 | Kub | ....................... | B82Y 10/00 257/15 |
| 2013/0171347 A1* | 7/2013 | Yakimova | ............... | B82Y 30/00 427/227 |
| 2014/0291282 A1* | 10/2014 | Bedell | ................... | B32B 43/006 216/2 |

* cited by examiner

LAMINATED BODY AND ELECTRONIC DEVICE

BACKGROUND OF THE INVENTION

Field of the Invention

The present invention relates to a laminated body and an electronic device. The present application claims a priority based on Japanese Patent Application No. 2015-218773 filed on Nov. 6, 2015. The entire content of Japanese Patent Application No. 2015-218773 is incorporated herein by reference.

Description of the Background Art

Graphene is a substance in which carbon atoms form $sp^2$ hybrid orbitals and are bonded two-dimensionally. Due to such a bonding state of carbon, graphene is characterized as having a very high carrier mobility. Hence, by using a graphene film as a channel of an electronic device such as a transistor, it is expected to attain high speed of the electronic device, for example.

By producing a laminated body including the graphene film and by forming an electrode or the like on the laminated body, it is possible to manufacture an electronic device employing the graphene film as a conductive portion (for example, channel). The laminated body including the graphene film can be manufactured, for example, in the following manner: a graphene thin film detached from graphite is adhered to a supporting substrate; or a graphene thin film grown by CVD (Chemical Vapor Deposition) is adhered to a supporting substrate.

In order to secure acceptable production efficiency in mass-producing electronic devices, a supporting substrate having a large diameter (for example, having a diameter of not less than 2 inches) is preferably employed in the laminated body. In the laminated body produced in the procedure including the adhesion of the graphene film as described above, a large region with no graphene film is included in a surface of the supporting substrate. In such a case, automation is obstructed in a process of manufacturing the electronic devices, such as alignment for electrode formation. As a result, it becomes difficult to mass-produce electronic devices each employing the laminated body described above, disadvantageously.

To address this, the following method has been proposed: a substrate composed of SiC (silicon carbide) is heated to separate Si atoms in order to convert a surface layer portion of the substrate into graphene, thereby obtaining a laminated body in which a graphene film is formed on a substrate (for example, see Japanese Patent Laying-Open No. 2015-48258). This reduces the region with no graphene film on the main surface of the substrate. As a result, mass production of electronic devices using the laminated body is facilitated.

SUMMARY OF THE INVENTION

A laminated body according to the present disclosure includes: a substrate portion composed of silicon carbide; and a graphene film disposed on a first main surface of the substrate portion, the graphene film having an atomic arrangement oriented with respect to an atomic arrangement of the silicon carbide of the substrate portion. A region in which a value of G'/G in Raman spectrometry is not less than 1.2 is not less than 10% in an area ratio in an exposed surface of the graphene film, the exposed surface being a main surface of the graphene film opposite to the substrate portion.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Technical Problem

Figure 1:
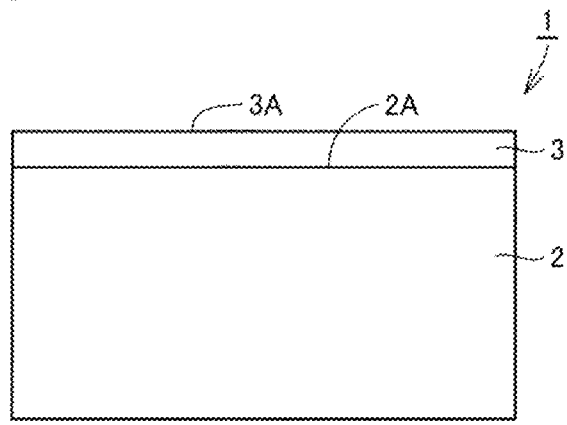
FIG. 1 is a schematic cross sectional view showing a structure of a laminated body including a graphene film.

When the laminated body having the graphene film formed on the substrate portion composed of SiC is used to manufacture an electronic device having the graphene film serving as a conductive portion, mobility in the conductive portion may become lower than an expected value.

In view of this, it is one of objects to provide: a laminated body by which high mobility can be stably secured when manufacturing an electronic device having a graphene film serving as a conductive portion; and an electronic device employing a graphene film, which is capable of stably securing high mobility, as a conductive portion.

Advantageous Effect of the Present Disclosure

According to the laminated body described above, high mobility can be stably secured when manufacturing an electronic device having a graphene film serving as a conductive portion.

Description of Embodiment of the Invention of the Present Application

First, embodiments of the invention of the present application are listed and described. A laminated body of the present application includes: a substrate portion composed of silicon carbide; and a graphene film disposed on a first main surface of the substrate portion, the graphene film having an atomic arrangement oriented with respect to an atomic arrangement of the silicon carbide of the substrate portion. A region in which a value of G'/G in Raman spectrometry is not less than 1.2 is not less than 10% in an area ratio in an exposed surface of the graphene film, the exposed surface being a main surface of the graphene film opposite to the substrate portion.

The present inventors have studied a cause of a lower mobility in a conductive portion than an expected value when manufacturing an electronic device having a graphene film serving as the conductive portion by using a laminated body having the graphene film formed on a substrate portion composed of SiC. As a result, it has been found that the mobility is greatly affected by a value of G'/G in Raman spectrometry in a graphene film having an atomic arrangement oriented with respect to an atomic arrangement of the SiC of the substrate portion. Moreover, according to the study of the present inventors, high mobility can be stably secured when the area ratio of the region in which the value of G'/G is not less than 1.2 is not less than 10%.

In the laminated body of the present application, the region in which the value of G'/G in Raman spectrometry is not less than 1.2 is not less than 10% in the area ratio in the exposed surface of the graphene film. Accordingly, by forming an electrode on such an exposed surface, it is possible to manufacture an electronic device in which high mobility is stably secured. Thus, according to the laminated body of the present application, a laminated body can be provided which is capable of stably securing high mobility when manufacturing an electronic device in which a graphene film serves as a conductive portion.

Here, G' is the height of a peak appearing near 2700 cm$^{-1}$ and G is the height of a peak appearing near 1600 cm$^{-1}$ (Raman shift) when the Raman spectrometry is performed. Moreover, G'/G is a ratio of G' to G (ratio of the peak heights).

It should be noted that in order to more stably secure high mobility, the region in which the value of G'/G is not less than 1.2 is preferably not less than 35% of the above exposed surface in the area ratio.

In the laminated body, the graphene film covers not less than 95% of the first main surface of the substrate portion. This reduces a region with no graphene film on the first main surface of the substrate portion. As a result, mass production of electronic devices using the laminated body is facilitated.

In the laminated body, the graphene film preferably has a carrier mobility of not less than 5000 cm$^2$/Vs, and more preferably has a carrier mobility of not less than 8000 cm$^2$/Vs. In this way, high speed of the electronic device manufactured using the laminated body can be attained.

In the laminated body, the substrate portion may have a disc-like shape. The substrate portion may have a diameter of not less than 50 mm. This leads to increased efficiency in manufacturing electronic devices using the laminated body.

An electronic device of the present application includes: the above-described laminated body; a first electrode formed in contact with the exposed surface of the laminated body; and a second electrode formed in contact with the exposed surface of the laminated body and formed to be separated from the first electrode.

In the electronic device of the present application, a region in which a value of G'/G is not less than 1.2 is not less than 10% in an area ratio in an exposed surface of the graphene film between the first electrode and the second electrode. Accordingly, according to the electronic device of the present application, high mobility in the conductive portion can be secured stably.

Details of Embodiments of the Invention of the Present Application

Next, the following describes one embodiment of a laminated body according to the present invention with reference to figures. It should be noted that in the below-mentioned figures, the same or corresponding portions are given the same reference characters and are not described repeatedly.

With reference to FIG. 1, a laminated body 1 in the present embodiment includes a substrate portion 2 and a graphene film 3. Substrate portion 2 is composed of silicon carbide (SiC). The SiC of substrate portion 2 is hexagonal SiC and has a 6H structure, for example. Substrate portion 2 has a disc-like shape. Substrate portion 2 has a diameter of not less than 2 inches (not less than 50 mm).

Graphene film 3 is disposed on a first main surface 2A of substrate portion 2. Graphene film 3 is composed of graphene having an atomic arrangement oriented with respect to an atomic arrangement of the SiC of substrate portion 2. Here, the state in which the atomic arrangement of the graphene of graphene film 3 is oriented with respect to the atomic arrangement of the SiC of substrate portion 2 means that the atomic arrangement of the graphene has a certain relation with the atomic arrangement of the SiC. Whether or not the atomic arrangement of the graphene is oriented with respect to the atomic arrangement of the SiC can be checked through a LEED (Low Energy Electron Diffraction) method, for example. In an exposed surface 3A of graphene film 3, a region in which a value of G'/G in Raman spectrometry is not less than 1.2 is not less than 10% in an area ratio. Exposed surface 3A is a main surface of graphene film 3 opposite to substrate portion 2.

In exposed surface 3A of graphene film 3 of laminated body 1 of the present embodiment, the region in which the value of G'/G is not less than 1.2 is not less than 10% in the area ratio. Hence, by forming an electrode on exposed surface 3A, an electronic device in which high mobility is stably secured can be manufactured. Thus, laminated body 1 of the present embodiment is a laminated body by which high mobility can be stably secured when manufacturing an electronic device having graphene film 3 serving as a conductive portion.

Moreover, in laminated body 1, graphene film 3 preferably covers not less than 95% of first main surface 2A of substrate portion 2. This reduces a region having no graphene film 3 in first main surface 2A of substrate portion 2. As a result, mass production of electronic devices using laminated body 1 is facilitated.

Figure 2:
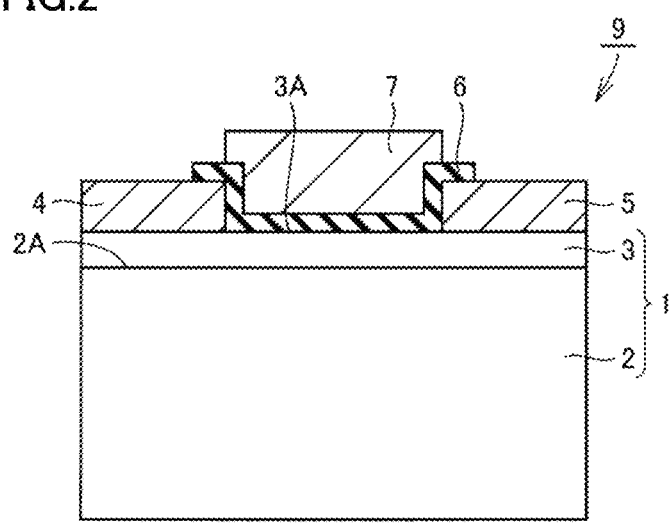
FIG. 2 is a schematic cross sectional view showing a structure of a field effect transistor (FET) including the graphene film.

Next, the following describes a FET (Field Effect Transistor), which is an exemplary electronic device produced using laminated body 1. With reference to FIG. 2, a FET 9 in the present embodiment is produced using laminated body 1 of the present embodiment described above, and includes substrate portion 2 and graphene film 3 both layered in the same manner as in laminated body 1. FET 9 further includes: a source electrode 4 serving as a first electrode; a drain electrode 5 serving as a second electrode; a gate electrode 7 serving as a third electrode; and a gate insulating film 6.

Source electrode 4 is formed in contact with exposed surface 3A. Source electrode 4 is composed of a conductor capable of ohmic contact with graphene film 3, such as Ni (nickel)/Au (gold). Drain electrode 5 is formed in contact with exposed surface 3A. Drain electrode 5 is formed to be separated from source electrode 4. Drain electrode 5 is composed of a conductor capable of ohmic contact with graphene film 3, such as Ni/Au.

Gate insulating film 6 is formed to cover exposed surface 3A of graphene film 3 between source electrode 4 and drain electrode 5. Gate insulating film 6 extends to a region covering: exposed surface 3A between source electrode 4 and drain electrode 5; and portions of upper surfaces of source electrode 4 and drain electrode 5 (main surfaces opposite to the sides in contact with graphene film 3). Gate insulating film 6 is composed of an insulator such as aluminum oxide ($Al_2O_3$).

Gate electrode 7 is disposed on and in contact with gate insulating film 6. Gate electrode 7 is disposed at a region corresponding to exposed surface 3A between source electrode 4 and drain electrode 5. Gate electrode 7 is composed of a conductor such as Ni/Au.

When voltage applied to gate electrode 7 in this FET 9 is less than a threshold voltage, i.e., when FET 9 is off, a non-conductive state is maintained even under application of voltage between source electrode 4 and drain electrode 5. On the other hand, when FET 9 becomes on in response to application of voltage of not less than the threshold voltage to gate electrode 7, source electrode 4 and drain electrode 5 are electrically connected to each other by a region (channel region) of graphene film 3 facing gate electrode 7 with gate insulating film 6 interposed therebetween. When voltage is applied between source electrode 4 and drain electrode 5 in such a state, current flows between source electrode 4 and drain electrode 5.

Here, the region in which the value of G'/G is not less than 1.2 is not less than 10% in the area ratio at exposed surface 3A between source electrode 4 and drain electrode 5 in FET 9 of the present embodiment. Therefore, high mobility is stably secured in graphene film 3 serving as a conductive portion and corresponding to the channel region. As a result, FET 9 is an electronic device in which high speed is attained.

Figure 3:
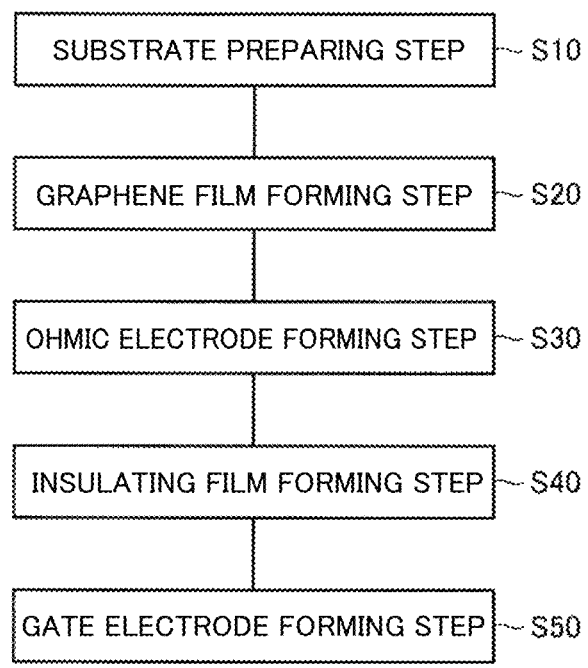
FIG. 3 is a flowchart schematically showing methods for manufacturing the laminated body and the field effect transistor both including the graphene film.
Figure 4:
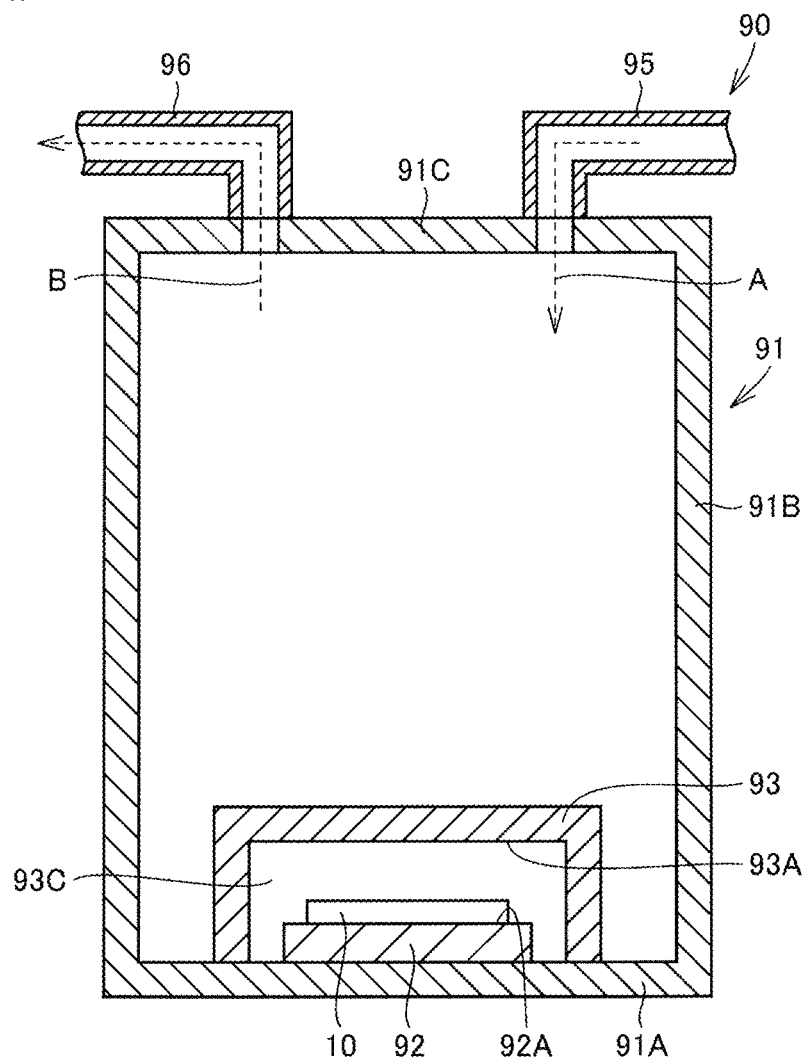
FIG. 4 is a schematic cross sectional view showing a structure of a manufacturing apparatus for the laminated body including the graphene film.

Next, with reference to FIG. 3 and FIG. 4, the following describes an overview of respective methods for manufacturing laminated body 1 and FET 9 in the present embodiment.

With reference to FIG. 3, in each of the methods for manufacturing laminated body 1 and FET 9 in the present embodiment, a substrate preparing step is first performed as a step (S10). In this step (S10), a substrate is prepared which has a diameter of, for example, 2 inches (50.8 mm) and which is composed of 6H-SiC. More specifically, an ingot composed of SiC is sliced, thereby obtaining the substrate composed of SiC. A surface of the substrate is polished, and then the substrate is subjected to a process such as washing, thereby preparing a substrate in which main surface flatness and cleanness are secured.

Next, a graphene film forming step is performed as a step (S20). This step (S20) can be performed using a manufacturing apparatus for the laminated body as shown in FIG. 4, for example. With reference to FIG. 4, manufacturing apparatus 90 for the laminated body includes a main body portion 91, a susceptor 92, a cover member 93, a gas introducing pipe 95, and a gas discharging pipe 96.

Main body portion 91 includes: a side wall portion 91B having a hollow cylindrical shape; a bottom wall portion 91A closing a first end portion of side wall portion 91B; and an upper wall portion 91C closing a second end portion of side wall portion 91B. Susceptor 92 is disposed on bottom wall portion 91A in main body portion 91. Susceptor 92 has a substrate holding surface 92A for holding substrate 10.

In main body portion 91, cover member 93 for covering susceptor 92 is disposed. Cover member 93 has a hollow cylindrical shape having a pair of end portions, one of which is closed and the other of which is opened, for example. Cover member 93 is disposed such that the other end portion side of cover member 93 is in contact with bottom wall portion 91A. Susceptor 92 and substrate 10 on susceptor 92 are surrounded by cover member 93 and bottom wall portion 91A of main body portion 91. Susceptor 92 and substrate 10 on susceptor 92 are disposed in a closed space 93C, which is a space defined by cover member 93 and bottom wall portion 91A of main body portion 91. An inner wall surface 93A of cover member 93 faces a surface (one main surface) of substrate 10.

Gas introducing pipe 95 and gas discharging pipe 96 are connected to upper wall portion 91C of main body portion 91. Each of gas introducing pipe 95 and gas discharging pipe 96 has one end connected to a through hole formed in upper wall portion 91C. The other end portion of gas introducing pipe 95 is connected to a gas holding portion (not shown) for holding inert gas therein. In the present embodiment, argon is held in the gas holding portion. The other end portion of gas discharging pipe 96 is connected to an exhausting device (not shown) such as a pump.

The step (S20) can be performed as follows using manufacturing apparatus 90 for the laminated body. First, substrate 10 prepared in the step (S10) and composed of SiC is disposed on substrate holding surface 92A of susceptor 92. Next, cover member 93 is disposed on bottom wall portion 91A to cover susceptor 92 and substrate 10. Accordingly, susceptor 92 and substrate 10 on susceptor 92 are surrounded by cover member 93 and bottom wall portion 91A of main body portion 91.

Next, a bulb (not shown) provided in gas introducing pipe 95 is closed, and a bulb provided in gas discharging pipe 96 is opened. Then, the exhausting device connected to gas discharging pipe 96 is operated, thereby exhausting the gas from inside main body portion 91 via gas discharging pipe 96 along an arrow B. Accordingly, pressure in main body portion 91 is reduced. Here, although susceptor 92 and substrate 10 are surrounded by cover member 93 and bottom wall portion 91A of main body portion 91, cover member 93 and bottom wall portion 91A are not bonded to each other. Hence, when the pressure in main body portion 91 is decreased, the gas therein is exhausted from a small gap between cover member 93 and bottom wall portion 91A due to a pressure difference between the inside and outside of closed space 93C. As a result, the pressure in closed space 93C is also decreased.

Next, the operation of the exhausting device is stopped and the bulb provided in gas introducing pipe 95 is opened. Accordingly, argon held in the gas holding portion is introduced into main body portion 91 through gas introducing pipe 95 (arrow A). Here, when the pressure in main body portion 91 is increased, the argon enters via the small gap between cover member 93 and bottom wall portion 91A due to the pressure difference between the inside and outside of closed space 93C. In this way, the gas in main body portion 91 is replaced with the argon. When the pressure of the argon in main body portion 91 is increased up to the normal pressure (atmospheric pressure), an excess of argon is exhausted from gas discharging pipe 96, thereby maintaining the pressure therein at the normal pressure. That is, the inside of main body portion 91 is maintained to be an argon atmosphere under the normal pressure.

Next, substrate 10 is heated. Substrate 10 is heated by heating main body portion 91, for example. Main body portion 91 may be heated by induction heating, for example. Substrate 10 is heated in argon under the normal pressure at a temperature of not less than 1300° C. and not more than 1800° C., for example. Accordingly, Si atoms are separated from the SiC of substrate 10, thereby converting the surface layer portion of substrate 10 into graphene. The graphene thus resulting from the conversion has an atomic arrangement oriented with respect to the atomic arrangement of the SiC of substrate 10. As a result, with reference to FIG. 1, laminated body 1 is obtained which includes: substrate portion 2 composed of SiC; and graphene film 3 disposed on first main surface 2A of substrate portion 2 and having the atomic arrangement oriented with respect to the atomic arrangement of the SiC of substrate portion 2.

With the above-described procedure, laminated body 1 in the present embodiment is completed. As described above, cover member 93 is employed in the present embodiment. Accordingly, the Si atoms separated from substrate 10 stay in closed space 93C. As a result, a vapor pressure of Si in closed space 93C is increased due to the separation of Si from substrate 10. This suppresses rapid conversion of SiC to graphene. Due to such suppression in the rate of conversion to graphene, one atomic layer or a small number of atomic layers (close to one atomic layer) of graphene film 3 is formed. As a result, with reference to FIG. 1, laminated body 1 is readily manufactured in which the region in which the value of G'/G in Raman spectrometry is not less than 1.2 is not less than 10% in the area ratio in exposed surface 3A of graphene film 3.

Next, with reference to FIG. 3, an ohmic electrode forming step is performed as a step (S30). In this step (S30), with reference to FIG. 1 and FIG. 2, source electrode 4 and drain electrode 5 are formed in contact with exposed surface 3A of laminated body 1. Source electrode 4 and drain electrode 5 can be formed, for example, by: forming, on exposed surface 3A of graphene film 3, a mask layer, which is constituted of a resist and has an opening corresponding to a region to be provided with source electrode 4 and drain electrode 5; forming a conductive film composed of a conductor (for example, Ni/Au) to constitute source electrode 4 and drain electrode 5; and then performing lift-off.

Next, with reference to FIG. 3, an insulating film forming step is performed as a step (S40). In this step (S40), with reference to FIG. 2, gate insulating film 6 is formed to cover exposed surface 3A of graphene film 3 between source electrode 4 and drain electrode 5. Gate insulating film 6 can be formed, for example, by: forming a mask layer, which is constituted of a resist and has an opening corresponding to a region to be provided with gate insulating film 6; forming an insulating film composed of an insulator (for example, aluminum oxide) to constitute gate insulating film 6; and then performing lift-off.

Next, with reference to FIG. 3, a gate electrode forming step is performed as a step (S50). In this step (S50), with reference to FIG. 2, gate electrode 7 is formed on and in contact with gate insulating film 6 to cover exposed surface 3A between source electrode 4 and drain electrode 5. Gate electrode 7 can be formed, for example, by: forming a mask layer, which is constituted of a resist and has an opening corresponding to a region to be provided with gate electrode 7; forming a conductive film composed of a conductor (for example, Ni/Au) to constitute gate electrode 7; and then performing lift-off. With the above steps, FET 9 in the present embodiment is completed. Then, for example, dicing is performed to obtain respective elements.

EXAMPLE

An experiment was conducted to evaluate, in terms of G'/G in accordance with the Raman spectrometry method, a graphene film 3 of a laminated body 1 produced in the same procedure as that in the above embodiment. Moreover, an experiment was conducted to examine a relation between G'/G and mobility. The procedures and results of the experiments are as follows.

Raman spectrometry was performed to exposed surface 3A of graphene film 3 of laminated body 1 produced in the same procedure as that in the above embodiment. As a Raman spectrometry device, LAbRAM HR-800 provided from HORIBA Jobin Yvon was employed. For the Raman spectrometry, a laser wavelength was set at 532 nm, laser intensity on a sample was set at 10 mW, grating was set at 300 gr/mm, integration time was set at 0.5 second, an integration count was set at 2, and an objective lens was of ×100.

Figure 5:
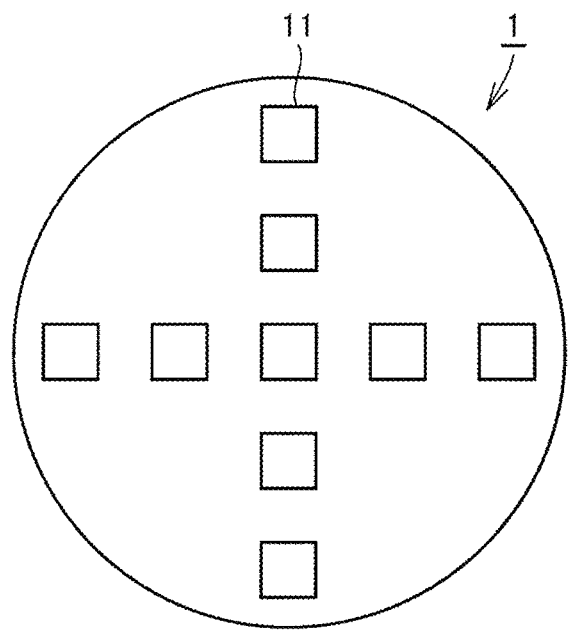
FIG. 5 is a schematic view for illustrating a method for evaluating the graphene film using Raman spectrometry.

FIG. 5 shows measurement regions in the main surface of laminated body 1 at the exposed surface 3A side. Nine measurement regions 11 were employed as shown in FIG. 5 in order to evaluate the whole of graphene film 3. Specifically, nine measurement regions 11 each with a square shape having each side of 50 µm were set. Measurement regions 11 were set at an equal interval on two straight lines orthogonal to each other at the center of the main surface of circle-shaped laminated body 1 at the exposed surface 3A side. One measurement region 11 was set which had diagonal lines having an intersection corresponding to the center. Based on this measurement region 11, the other eight measurement regions 11 were set.

Figure 6:
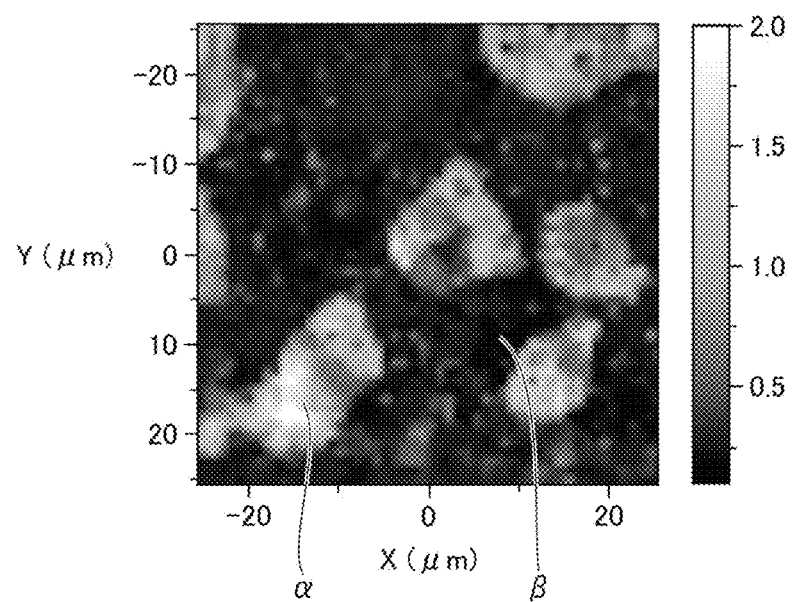
FIG. 6 shows an example of a result of the evaluation for the graphene film using the Raman spectrometry.
Figure 7:
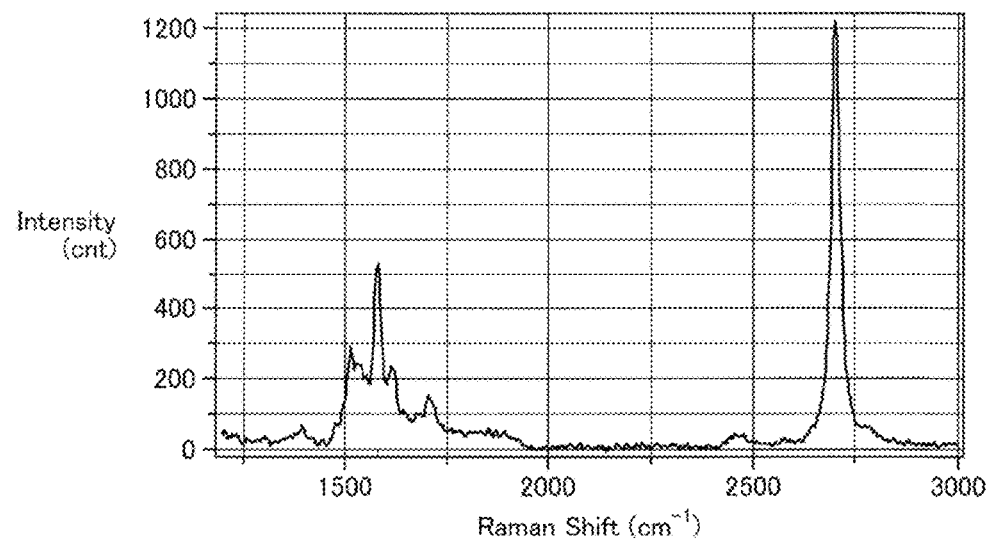
FIG. 7 shows a result of the Raman spectrometry corresponding to a region α of FIG. 6.
Figure 8:
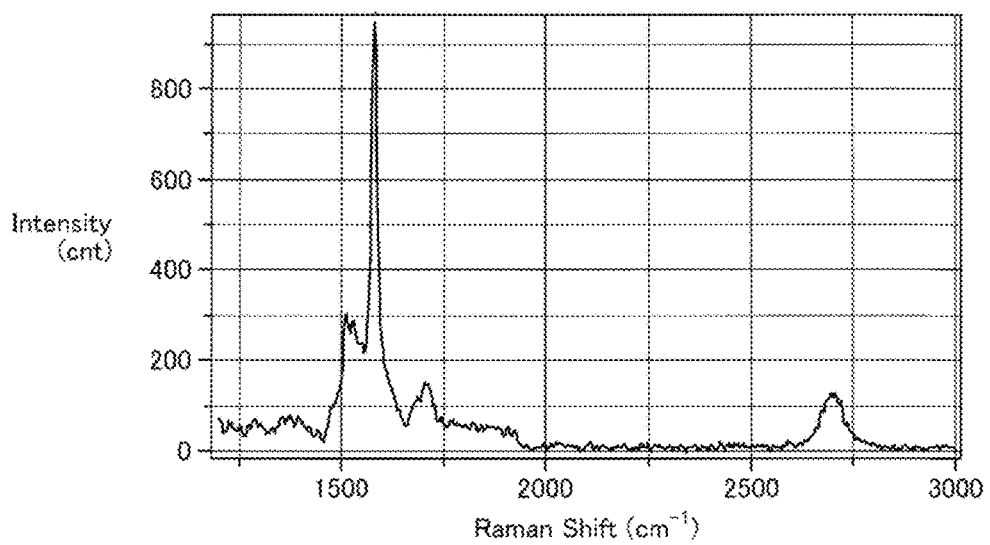
FIG. 8 shows a result of the Raman spectrometry corresponding to a region β of FIG. 6.

In each of measurement regions 11, measurement was performed to scan the inside of measurement region 11 at a step interval of 1 µm. That is, measurement was performed at 2500 points in each of measurement regions 11. Laminated body 1 having graphene film 3, which is formed on substrate portion 2 composed of SiC and has the atomic arrangement oriented with respect to the atomic arrangement of the SiC of substrate portion 2, has high durability to laser. Hence, the laser intensity on the sample can be set at several mW to several ten mW. Accordingly, spectrum data for one point can be obtained in a short time, whereby the measurement at 2500 points can be performed within a permissible time. An image was created in which respective values of G'/G in the points as obtained by the measurement were indicated in gradation. An example of such an obtained image is shown in FIG. 6. With reference to FIG. 6, by creating such an image, distribution of the values of G'/G in measurement regions 11 can be clearly understood. FIG. 7 and FIG. 8 show respective results of the Raman spectrometry corresponding to points α and β in FIG. 6. In FIG. 7 and FIG. 8, the height of a peak near 2700 $cm^{-1}$ is G' and the height of a peak near 1600 $cm^{-1}$ is G. It is confirmed that a bright region in FIG. 6 corresponds to a region with a large value of G'/G and a dark region corresponds to a region with a small value of G'/G.

Based on such data, a ratio of the region in which the value of G'/G in exposed surface 3A is not less than 1.2 can be found. As a result of evaluating laminated body 1 produced in the present example, it was confirmed that the region in which the value of G'/G was not less than 1.2 was not less than 10% in the area ratio. The ratio of the region in which the value of G'/G was not less than 1.2 may be determined from image data such as the one shown in FIG. 6, or may be derived from a histogram of the respective values of G'/G in the points.

Next, carrier mobilities were measured in graphene films having different values of G'/G to examine a relation between the value of G'/G and mobility. The mobilities were measured by way of Hall measurement according to the Van der Pauw method. In the same procedure as that in the above embodiment, graphene film 3 in the form of a square in a planar shape was formed on substrate portion 2. Then, carrier mobility in each graphene film 3 was measured under the following conditions: an interval between electrodes was 100 µm; and a measurement temperature was a room temperature. Results of the examination are shown in FIG. 9.

Figure 9:
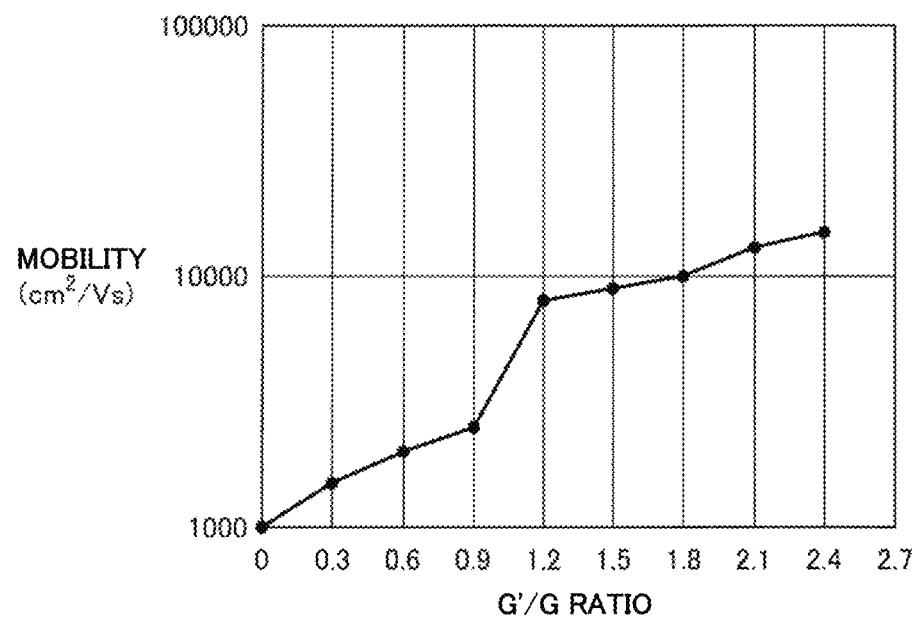
FIG. 9 shows a relation between a value of G'/G and mobility.

A value on the horizontal axis in FIG. 9 indicates that the area ratio of the portion in which the value of G'/G was not less than the value of the horizontal axis was 10%. For example, when the value on the horizontal axis is 1.5, it is indicated that the area ratio of the portion in which the value of G'/G is not less than 1.5 is 10%. Moreover, the vertical axis in FIG. 9 represents mobility, and is a logarithm axis. With reference to FIG. 9, the mobility tends to be larger as the value of G'/G is larger. Moreover, the mobility is abruptly increased between 0.9 and 1.2 in the value of G'/G. That is, it is confirmed that high mobility can be stably secured when the region in which the value of G'/G is not less than 1.2 is not less than 10% in the area ratio. Moreover, with reference to FIG. 9, the region in which the value of G'/G is not less than 1.5 is preferably not less than 10% in the area ratio, and the region in which the value of G'/G is not less than 1.8 is more preferably not less than 10% in the area ratio. By increasing the value of G'/G, mobility of not less than 5000 cm$^2$/Vs is obtained, furthermore, mobility of not less than 8000 cm$^2$/Vs is obtained.

It should be noted that as shown in FIG. 6, in exposed surface 3A, there may be a plurality of regions (high G'/G regions) in which the value of G'/G is not less than 1.2. In order to stably manufacture electronic devices having high mobility, the width of each high G'/G region (the maximum length of a hypothetical line segment that can be disposed in the high G'/G region without passing through a region other than the high G'/G region) is preferably not less than the width of the electronic device to be manufactured, such as not less than 5 μm. Furthermore, in order to manufacture the electronic device while securing high yield, the width of the high G'/G region is preferably ten times or more as large as the width of the electronic device to be manufactured, such as not less than 50 μm. That is, in exposed surface 3A, a high G'/G region having a width of not less than 5 μm is preferably formed, and a high G'/G region having a width of not less than 50 μm is more preferably formed.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A laminated body comprising:
    a substrate portion composed of silicon carbide; and
    a graphene film disposed on a first main surface of the substrate portion, the graphene film having an atomic arrangement oriented with respect to an atomic arrangement of the silicon carbide of the substrate portion,
    a region in which a value of G'/G in Raman spectrometry is not less than 1.2 being not less than 10% of the area of an exposed surface of the graphene film, the exposed surface being a main surface of the graphene film opposite to the substrate portion,
    the substrate portion has a disc-like shape, and
    the substrate portion has a diameter of not less than 50 mm.

2. The laminated body according to claim 1, wherein the graphene film covers not less than 95% of the first main surface of the substrate portion.

3. The laminated body according to claim 1, wherein the graphene film has a carrier mobility of not less than 5000 cm2/Vs.

4. A laminated body comprising:
    a substrate portion composed of silicon carbide; and
    a graphene film disposed on a first main surface of the substrate portion, the graphene film having an atomic arrangement oriented with respect to an atomic arrangement of the silicon carbide of the substrate portion,
    a region in which a value of GIG in Raman spectrometry is not less than 1.2 being not less than 10% of the area of an exposed surface of the graphene film, the exposed surface being a main surface of the graphene film opposite to the substrate portion,
    the graphene film covering not less than 95% of the first main surface of the substrate portion,
    the graphene film having a carrier mobility of not less than 5000 cm2/Vs,
    the substrate portion having a disc-like shape,
    the substrate portion having a diameter of not less than 50 mm.

5. An electronic device comprising:
    the laminated body recited in claim 1;
    a first electrode formed in contact with the exposed surface of the laminated body; and
    a second electrode formed in contact with the exposed surface of the laminated body and formed to be separated from the first electrode.

* * * * *